(12) United States Patent
Henningsson et al.

(10) Patent No.: US 7,474,176 B2
(45) Date of Patent: Jan. 6, 2009

(54) SLIDING SCREW ARRANGEMENT

(75) Inventors: Uno Henningsson, Haninge (SE); Christer Ahlberg, Kolbäck (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 10/541,837

(22) PCT Filed: Jan. 17, 2003

(86) PCT No.: PCT/SE03/00076

§ 371 (c)(1),
(2), (4) Date: Jul. 12, 2005

(87) PCT Pub. No.: WO2004/066496

PCT Pub. Date: Aug. 5, 2004

(65) Prior Publication Data

US 2006/0147293 A1   Jul. 6, 2006

(51) Int. Cl.
*H01P 7/06* (2006.01)

(52) U.S. Cl. .................. 333/231; 74/424.72; 74/89.42; 74/440

(58) Field of Classification Search .............. 74/424.89, 74/424.9, 424.91, 10 R, 424.72; 384/42, 384/26, 49; 333/231, 232, 235, 202, 205, 333/209, 223–226
See application file for complete search history.

(56) References Cited

U.S. PATENT DOCUMENTS

| | | | | |
|---|---|---|---|---|
| 2,824,258 A * | 2/1958 | Snow et al. ................. 315/5.21 |
| 3,157,293 A * | 11/1964 | Walters ....................... 414/639 |
| 3,169,407 A * | 2/1965 | Newell ........................ 74/424.9 |
| 3,554,338 A * | 1/1971 | Kennedy, Jr. ............. 192/48.92 |
| 3,743,976 A * | 7/1973 | Meyer et al. .................. 334/47 |
| 3,828,613 A * | 8/1974 | Sfreddo ....................... 74/10.41 |
| 3,927,572 A * | 12/1975 | Miner ......................... 74/10.8 |
| 3,951,001 A * | 4/1976 | Saito et al. ................. 74/10.52 |
| 3,987,680 A * | 10/1976 | Naoi et al. ................. 74/10.54 |
| 4,954,032 A * | 9/1990 | Morales ....................... 411/289 |
| 5,039,966 A * | 8/1991 | Schmid et al. .............. 333/229 |
| 5,438,172 A * | 8/1995 | Fowler et al. ............. 200/11 R |
| 6,467,131 B1 * | 10/2002 | Howie, Jr. ..................... 16/441 |
| 6,670,869 B2 * | 12/2003 | Henningsson et al. .... 333/219.1 |
| 2002/0150335 A1 * | 10/2002 | Lachance et al. ............. 385/37 |

FOREIGN PATENT DOCUMENTS

GB   1520420 A   8/1978

* cited by examiner

*Primary Examiner*—Richard W Ridley
*Assistant Examiner*—Terence Boes

(57) ABSTRACT

The present invention relates to a sliding screw arrangement (14) for transformation of the rotational movement of a threaded axis (13) into a linear movement of the sliding screw providing minimized tolerances for variations of the screw position in both radial and axial direction and providing minimized friction when moving the sliding screw arrangement along said threaded axis. The screw arrangement consists preferably of two parts (20, 30) and comprises a first resilient part, e.g. a spring (143), to compensate tolerances axial direction and a second resilient part, e.g. a resilient tongue (25), and tracks (28) to compensate tolerances in radial direction. The screw hollowness through which the threaded axis is guided is at its inside is equipped with semi-spheres (21,31) that follow the turn of a thread of the axis.

10 Claims, 5 Drawing Sheets

SLIDING SCREW ARRANGEMENT

FIELD OF THE INVENTION

The present invention relates to a sliding screw arrangement, e.g., applicable in a tuner arrangement.

BACKGROUND OF THE INVENTION

Radio base filters for filtering and combining of a number of sender units to one antenna cable are conventionally built up of various units, e.g. a cavity, a resonator, and one or more support units. The frequency range of such a filter is mainly determined by the dielectric properties of the resonator while the fine-adjustment of the filter frequency is achieved by means of adjusting the position of a tuner unit of an appropriate shape and consisting of a dielectric material in relation to said resonator unit. Commonly, this is achieved by means of inserting the tuner to a certain degree into a hollowness of the resonator. The tuning unit comprises, e.g., a ceramic tuner and a fastening means, e.g. a screw nut, that is movably arranged along a threaded axis in order to perform the movements of the tuner relative to the resonator. The threaded axis is driven by a motor unit whereby the screw nut transforms the radial movement of the threaded axis into a linear movement of the screw nut and the tuner.

For frequency tuning, e.g., in a radio base station, it is crucial to achieve a high precision for such frequency adjustments. This implies that the tolerances for undesired variations of the tuner position must be as small as possible. Preferably, a sliding screw or a similar arrangement is used.

SUMMARY OF THE INVENTION

A problem of screw arrangements according to the state of the art, e.g. when fastening a tuner unit, is the insufficient precision of position adjustments of the sliding screw along an axis of displacement.

It is thus an object of the present invention to achieve a sliding screw arrangement for transformation of the rotational movement of a threaded axis into a linear movement of the sliding screw providing minimised tolerances for variations of the tuner position in both radial and axial directions.

It is another object of the present invention to achieve a minimised friction when moving the sliding screw arrangement along the threaded axis.

These objects are achieved by means of the screw arrangement according to the present invention comprising a first resilient part, e.g. a spring, to compensate tolerances in axial direction and a second resilient part, e.g. a resilient tongue, and tracks to compensate tolerances in radial direction. The screw arrangement comprises a hollowness through which the threaded axis is guided and which at its inside is equipped with semi-spheres that follow the turn of a thread of the axis.

It is a first advantage of the screw arrangement according to the present invention that it is possible to achieve high precision and low tolerances in both axial and radial directions.

It is another advantage of the present invention that the screw arrangement provides a low degree of friction due to a small area of touching and due to a lack of revolving details. No lubrication is necessary.

It is still another advantage of the present invention that the details of the screw arrangement can be manufactured in plastic, e.g. by means of casting, which reduces the electric losses and implies a lower weight.

When applied in a tuning arrangement it is thus an overall advantage of the present invention that a frequency tuning can be performed both faster and with a higher precision.

The invention will now be described in more detail by help of preferred embodiments and with reference to the accompanying drawings.

DETAILED DESCRIPTION

Figure 1:
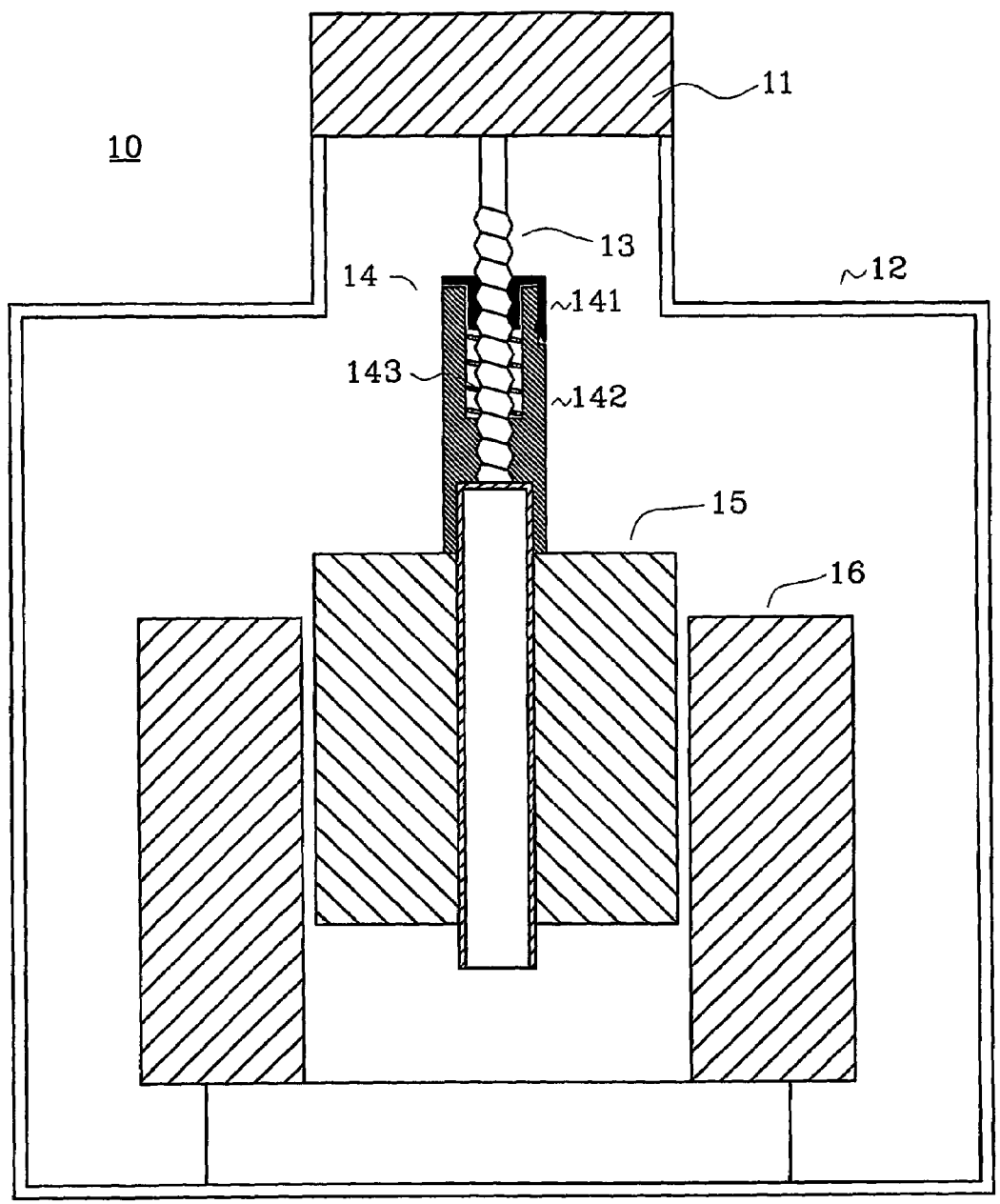
FIG. 1 shows a sliding screw arrangement according to the present invention that is arranged on a threaded axis for axial movements of a tuner body.

FIG. 1 shows a tuning arrangement 10 including a screw arrangement 14 according to the present invention. The figure shows a cavity 12, e.g. applied for frequency tuning in a radio base station, within which a resonator 16 and a tuner 15 is arranged. Frequency adjustments are achieved by means of varying the vertical position of the tuner 15 in relation to the resonator 16. A motor unit 11 drives a threaded motor axle 13 on which the screw arrangement 14 according to the present invention is mounted. The screw arrangement 14 consists of a first screw part 141 and a second screw part 142 that are connected to each other and comprising a resilience, e.g. a spring 143, between them. The second screw part is fixably attached to tuner 15 for preventing rotation of tuner 15. This arrangement is responsible for converting the rotational movement of the motor axle 13 into a linear movement of the object, e.g. the tuner, which is fastened at the screw arrangement. In order to achieve a high precision for frequency adjustments, i.e. a high precision for variations of the tuner position, the screw arrangement 14 according to the present invention must provide both a low friction between the surfaces of the screw and the threaded axis and low tolerances in both axial and radial direction in response to the rotational movements of the motor axle 13. The arrangement 14 comprises at its one end fastening means, e.g. a threaded part, for fastening of the tuner 18.

Figure 2A:
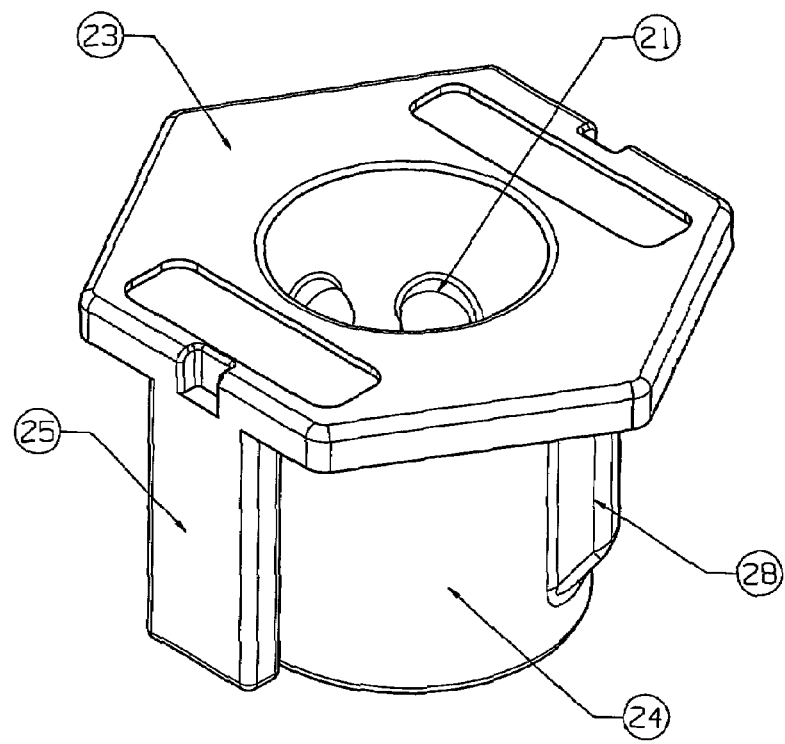
FIGS. 2a-2b show the first part of the screw arrangement according to the present invention in a perspective view and a cross section.
Figure 2B:
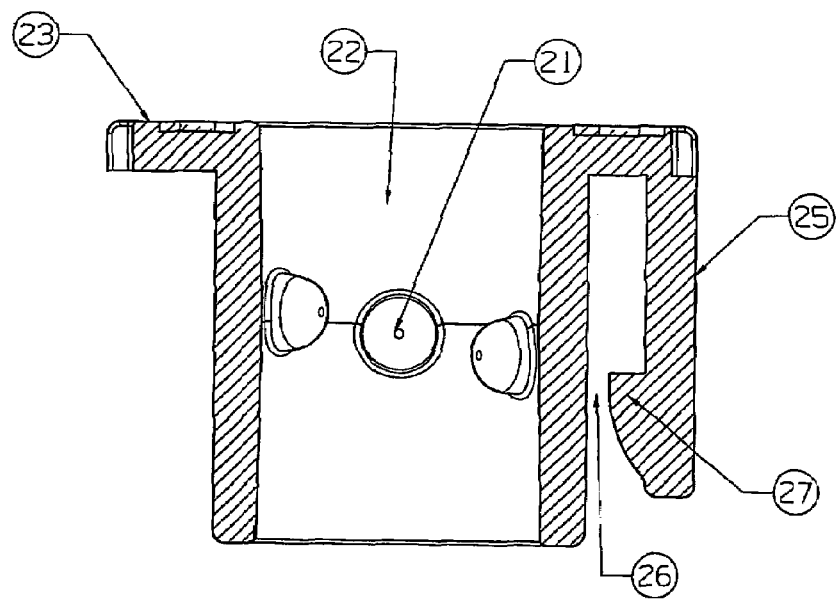
Figure 3A:
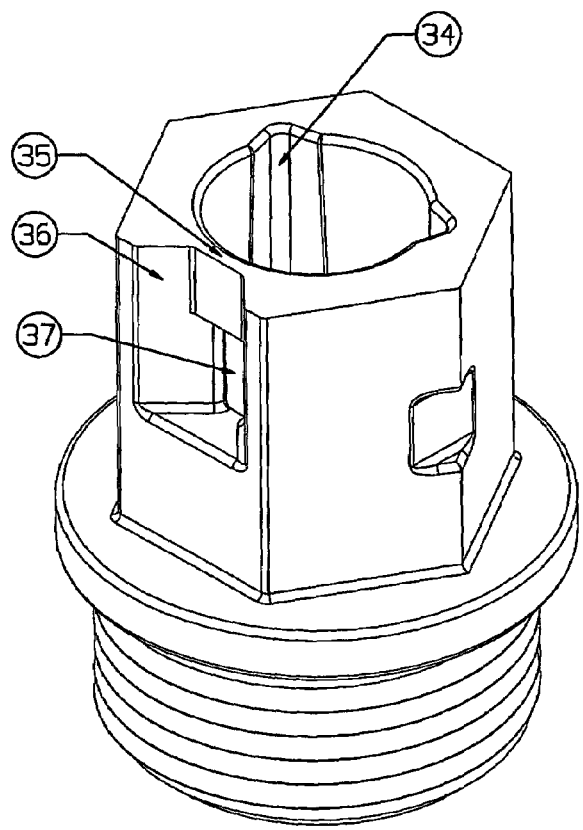
FIGS. 3a-3c show the second part of the screw arrangement according to the present invention in a perspective view, a cross section, and a view seen from above.
Figure 3B:
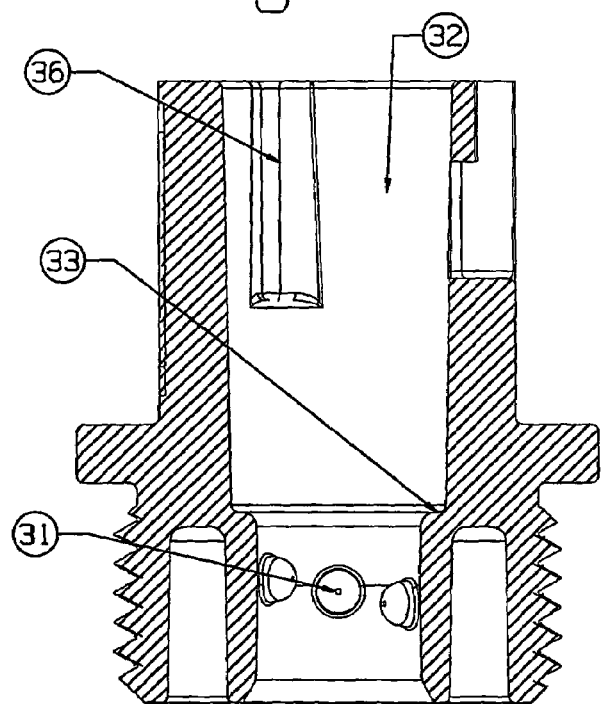

The screw arrangement according to the present invention consists of two parts, which are shown in perspective views in FIGS. 2a and 3a. Each of said parts 20,30 comprises a hollowness 22,32 through which the motor axis 13 of the cavity is protruded and which at its inside is equipped with one, preferably several, semi-spheres 21,31 that are arranged around the inside of said hollowness. The sliding properties of the screw can be influenced by the arrangement of said semi-spheres, their number and form. The semi-spheres are arranged to follow the threads of the axis 13 on which the screw arrangement is mounted. Preferably, the semi-spheres follow one turn, or a multiple of turns, of the threaded axis 13. However, it is nevertheless a conceivable alternative that the semi-spheres are arranged to follow only a part of one turn of the threaded axis or that there is only one single semi-sphere. For a preferred embodiment of the present invention it has turned out to be appropriate to apply at least three semi-spheres and, typically, six semi-spheres that follow one turn of the threaded axis and secure by that means a sufficient steering of the screw part along said axis. As explained later in more detail, the first and second screw part are mounted together comprising a certain resilience between them, which causes a force that presses the semi-spheres to opposite parts of the threaded axis. Therefore, the cross-section of the semi-spheres is preferably designed in such a way that there is a small touching surface between semi-spheres and threads in order to achieve a low friction while said touching surface at the same time must be sufficiently large to stand pressures when moving the screw arrangement including, e.g. a tuner object, along the threaded axis. This can be achieved, e.g., by means of a spherical cross section as indicated in FIGS. 2b and 3b. In order to minimise tolerances due to a bending of the first and second screw part when mounted together, the sections of semi-spheres for each screw part are preferably separated from each other as far as possible.

The FIGS. 2a-2b and 3a-3c relate to a screw arrangement consisting of two parts that can be inserted into each other. The first screw part 20, which is shown in FIGS. 2a and 2b, is built up of a screw hat 23 and, according to a preferred embodiment of the present invention, of a portion 24 having a cylindrical or another appropriate form. The screw hat 23 and the cylindrical portion comprises a diameter that is sufficiently large to allow said first screw part to be screwed on a threaded axis along which the screw arrangement shall be moved. In order to achieve a secure fastening of the first and second screw part and in order to eliminate the radial allowance of the screw arrangement the first screw part comprises at least one resilient tongue 25 that is fastened at the screw hat 23 and arranged in parallel to the cylindrical portion 24 such that there is a narrow slot 26 between said resilient tongue 25 and the cylindrical portion 24. The resilient tongue 25 is, according to a preferred embodiment of the present invention, at its end equipped with a bulge 27 that is directed towards the cylindrical portion 24. When the first and second screw part are mounted together, i.e. the cylindrical portion 24 is inserted into a corresponding opening of the second screw part 30, the outer edge 35 of the second screw part 30 can be inserted within said narrow slot 26 (see FIGS. 4a-4b). On that occasion the tongue 25 is guided along a track 36 of the second screw part 30 such that the bulge 27 can snap in a corresponding opening 37 of the second screw part 30 to provide a firm connection of both screw parts. The outside of the cylindrical portion 24 of the first screw part comprises one or more protrusions 28 that are arranged in a longitudinal direction along the cylindrical portion 24 in order to facilitate a correct mounting of the cylindrical portion of the first screw part into corresponding grooves 34 of the second screw part and in order to eliminate radial tolerances of said screw arrangement. This protrusions can have a spherical form or another appropriate form, e.g. a V-form.

The first and second screw part must be connected to each other in such a way that there is a certain resilience between them in order to eliminate the axial allowance. This resilience can be realised, e.g., by means of a resilient portion that is an integrated part of the first screw part 20 where the lower part of the cylindrical portion 24 is designed as a spring. In another embodiment the resilience is realised by means of a separate spring element 143 that is inserted within the hollowness 32 of the second screw part 30 such that its one end rests on a projection 33 within said hollowness while the other end lies on the lower edge of the cylindrical portion 24 of the first screw part 20. This spring element 143 is pressed together when the screw is mounted on the threaded motor axis 13 and exerts thus a force in a direction that presses the screw parts 20,30 away from each other. By that the semi-spheres 21,31 of each of the screw parts 20,30 are pressed to opposite sides of the threads of the threaded axis 13, which implies a secured position of the screw arrangement in axial direction that eliminates axial tolerances.

The first screw part 20 according to the preferred embodiment of the present invention, as shown in FIGS. 2a and 2b, is designed to be inserted into the second screw part 30. Another conceivable design could be a first screw part 20 that only consists of a screw hat 23 or comprising a cylindrical portion 24 of significantly reduced length. Such an embodiment comprises preferably more than one resilient tongue 25 as the first and second screw parts are connected to each other only by help of said tongues in a way as described above.

Figure 3C:
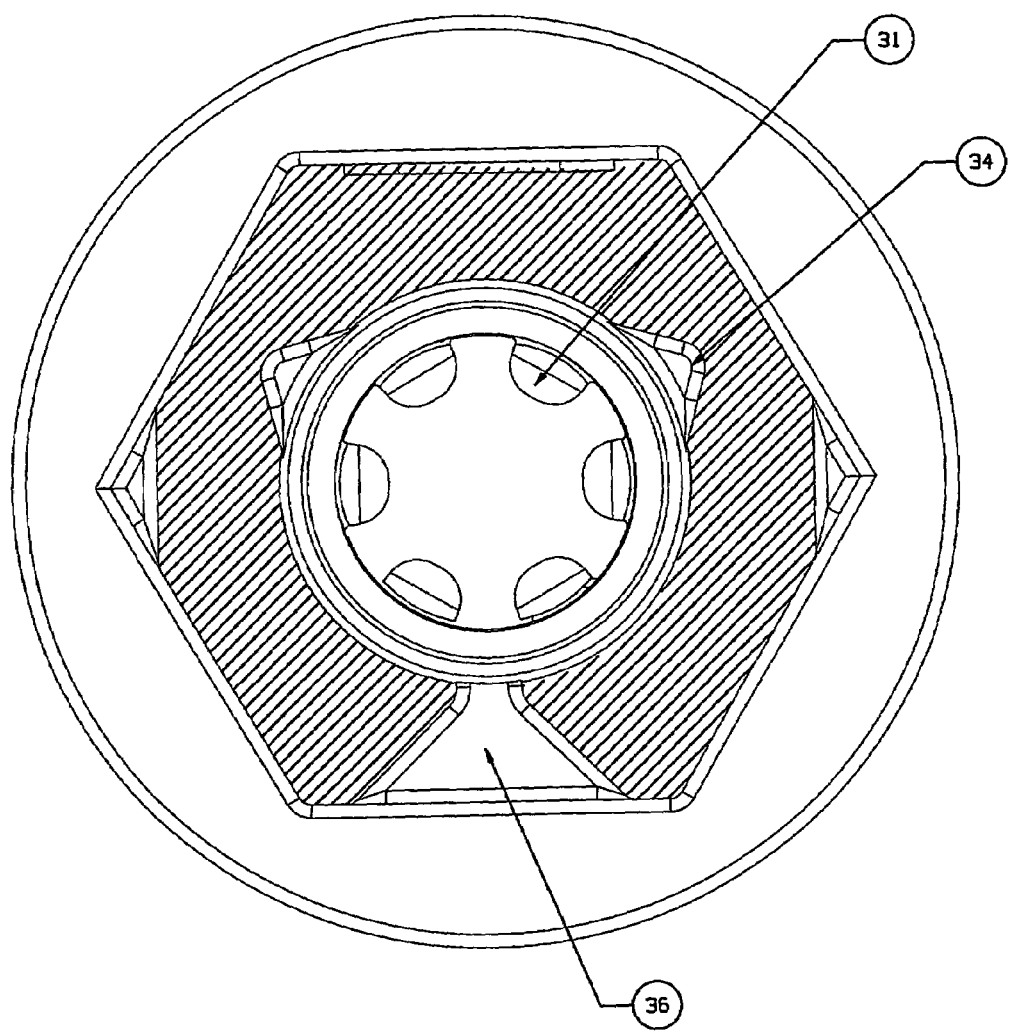
Figure 4A:
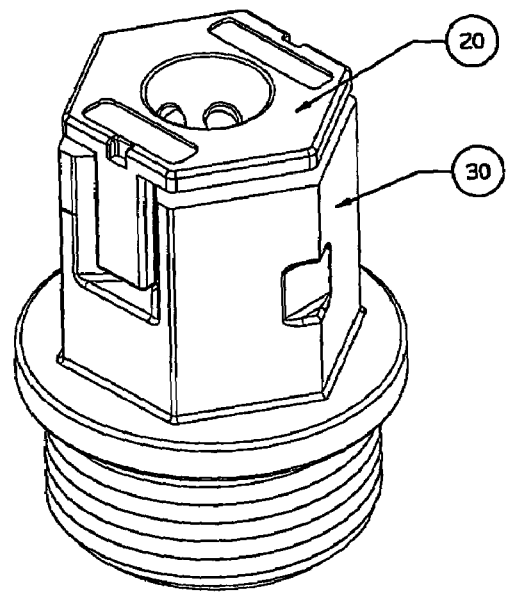
FIGS. 4a and 4b show the sliding screw arrangement according to the present invention comprising a first and a second part that are inserted into each other.
Figure 4B:
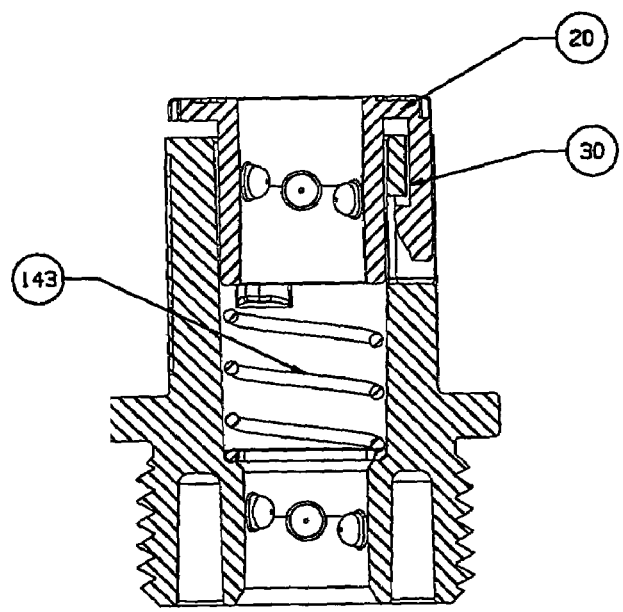

The second screw part 30, which is shown in FIGS. 3a-3c, comprises a hollowness 32 having a diameter that corresponds to the diameter of the cylindrical portion 24 of the first screw part 20 when assuming an embodiment where the first screw part 20 is inserted into the second screw part 30. If said first screw part 20 is equipped with protrusions 28 along its cylindrical portion 24 as described above the second screw part 30 must comprise grooves 34 of a corresponding form such that said protrusions 28 can be guided on said grooves 34 and thus allow a secure mounting of the screw parts 20,30 and prevent radial allowance. The second screw part 30 comprises at its one end a fastening means, preferably a screw threading, to fasten an object, e.g. a tuner, that shall be moved along the threaded axis 13.

An appropriate material for the screw arrangement according to the present invention is selected with respect to its electrical and mechanical properties. The material must comprise low electric losses when the screw arrangement is located, e.g., inside the tuner cavity, which implies that the screw can influence the electromagnetic field within the cavity. Regarding the mechanical properties, the screw must consist of a material having a low friction and a good sliding surface. An example of a conceivable material comprising low electric losses is polyeterimid, preferably comprising a certain concentration of teflon. Another material, which is conceivable for less demands on electric losses, is acetalplastics with a certain concentration of teflon.

The invention is not restricted to the embodiments that have been described above and have been shown in the drawings but can be modified within the scope of the accompanying claims.

The invention claimed is:

1. A screw arrangement forming a screw cavity for receiving a threaded axle, the screw arrangement comprising:
   a first screw part, comprising:
      a first wall portion forming a first portion of the screw cavity and having a first interior surface and a first exterior surface;
      a first set of stationary semi-spheres formed on the first interior surface and protruding into the first portion of the screw cavity; and
      a resilient tongue extending in a spaced-apart relationship along the first exterior surface and comprising a bulge extending toward the first exterior surface;
   a second screw part, comprising:
      a second wall portion forming a second portion of the screw cavity and having a second interior surface and a second exterior surface; and
      a second set of stationary semi-spheres formed on the second interior surface and protruding into the second portion of the screw cavity;
      wherein the second portion of the screw cavity is also for receiving the first wall portion and the second exterior surface forms a recess for receiving the bulge when the screw arrangement is assembled; and a resilient part disposed between and biased to separate the first screw part and the second screw part when the screw arrangement is assembled, the first screw part and the second screw part then being held in communication by the bulge and recess;

wherein the stationary semi-spheres are disposed to follow the turn of the threads of the threaded axle when the threaded axle is received into the screw cavity and rotated.

2. The screw arrangement according to claim 1, wherein the resilient part comprises a spring.

3. The screw arrangement according to claim 1, wherein the resilient part is integrally-formed with the first part of the screw arrangement.

4. The screw arrangement according to claim 1, wherein the second exterior surface forms a groove for receiving the resilient tongue adjacent to the recess for receiving the bulge.

5. The screw arrangement according to claim 1, wherein the first exterior surface comprises one or more protrusions and the second interior surface comprises corresponding grooves for receiving the protrusions when the screw arrangement is assembled.

6. The screw arrangement according to claim 1, wherein the first set of semi-spheres comprises at least three semi-spheres.

7. The screw arrangement according to claim 1, wherein said second part further comprises threads formed for the fastening of a tuner.

8. The screw arrangement according to claim 1, wherein the second set of semi-spheres comprises at least three semi-spheres.

9. A tuning arrangement, comprising:
a threaded axle;
a motor for rotating the threaded axle about a longitudinal axis;
a screw arrangement for translating the rotation of the threaded axle into longitudinal movement along the axle;
a resonator forming a central cavity; and
a tuner affixed to the screw arrangement and disposed within the central cavity of the resonator;
wherein the screw arrangement comprises
a first screw part, comprising:
a first wall portion forming a first portion of a screw cavity and having a first interior surface and a first exterior surface; and
a resilient tongue extending in a spaced-apart relationship along the first exterior surface and comprising a bulge extending toward the first exterior surface;
a second screw part, comprising a second wall portion forming a second portion of the screw cavity and having a second interior surface and a second exterior surface; wherein the second portion of the screw cavity is also for receiving the first wall portion, and wherein the second exterior surface forms a recess for receiving the bulge when the screw arrangement is assembled; and
a resilient part disposed between and biased to separate the first screw part and the second screw part when the screw arrangement is assembled, the first screw part and the second screw part then being held in communication by the bulge and recess.

10. The tuning arrangement according to claim 9, further comprising a plurality of stationary semi-spheres formed protruding into the screw cavity, wherein the plurality of semi-spheres are disposed to follow the turn of the threads of the threaded axle when the threaded axle is received into the screw cavity and rotated.

* * * * *